(12) United States Patent
Uno

(10) Patent No.: US 7,205,551 B2
(45) Date of Patent: Apr. 17, 2007

(54) METHOD OF CORRECTING CHROMATIC ABERRATIONS IN CHARGED-PARTICLE BEAM AND CHARGED-PARTICLE BEAM SYSTEM

(75) Inventor: Shinobu Uno, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 11/226,907

(22) Filed: Sep. 14, 2005

(65) Prior Publication Data
US 2006/0054837 A1  Mar. 16, 2006

(51) Int. Cl.
*H01J 37/22* (2006.01)
(52) U.S. Cl. ..................................... 250/397
(58) Field of Classification Search ................. 250/397
See application file for complete search history.

(56) References Cited

U.S. PATENT DOCUMENTS 7,095,031 B2 *  8/2006  Uno ........................ 250/396 R
2005/0156117 A1 *  7/2005  Uno ........................ 250/396 R

FOREIGN PATENT DOCUMENTS

WO  WO 01/56057 A1  8/2001

OTHER PUBLICATIONS

Von H. Rose, "Abbildungseigenschaften sphärisch korrigierter elektronenoptischer Achromate", *Optik 33*, Heft I (1971), pp. 1-24.

M. Haider, W. Bernhardt and H. Rose, "Design and Test of an Electric and Magnetic Dodecapole Lens", *Optik 63*, No. 1 (1982), pp. 9-23.

J. Zach, "Design of a High-Resolution Low-Voltage Scanning Electron Microscope", *Optik 83*, No. 1 (1989), pp. 30-40.

Joachim Zach and Maximilian Haider, "Aberration Correction in a Low Voltage SEM by a Multipole Corrector", *Nuclear Instruments and Methods in Physics Research A 363* (1995), pp. 316-325.

* cited by examiner

*Primary Examiner*—Albert Gagliardi
(74) *Attorney, Agent, or Firm*—The Webb Law Firm (57) ABSTRACT

Method and system for correcting chromatic aberrations in a charged-particle beam for automated correction of chromatic aberrations. The system directs a part of the charged-particle beam as a probe at a specimen. The system includes an extraction unit for extracting probe profiles from scanned images created by the beam, a chromatic aberration calculator for calculating chromatic aberrations in the system from the extracted probe profiles, and a correction unit for operating a chromatic aberration corrector based on the calculated chromatic aberrations.

5 Claims, 4 Drawing Sheets

METHOD OF CORRECTING CHROMATIC ABERRATIONS IN CHARGED-PARTICLE BEAM AND CHARGED-PARTICLE BEAM SYSTEM

BACKGROUND OF THE INVENTION

1. Field of the Invention

The present invention relates to a method of correcting chromatic aberrations in a charged-particle beam and to a charged-particle beam system.

2. Description of Related Art

Figure 5:
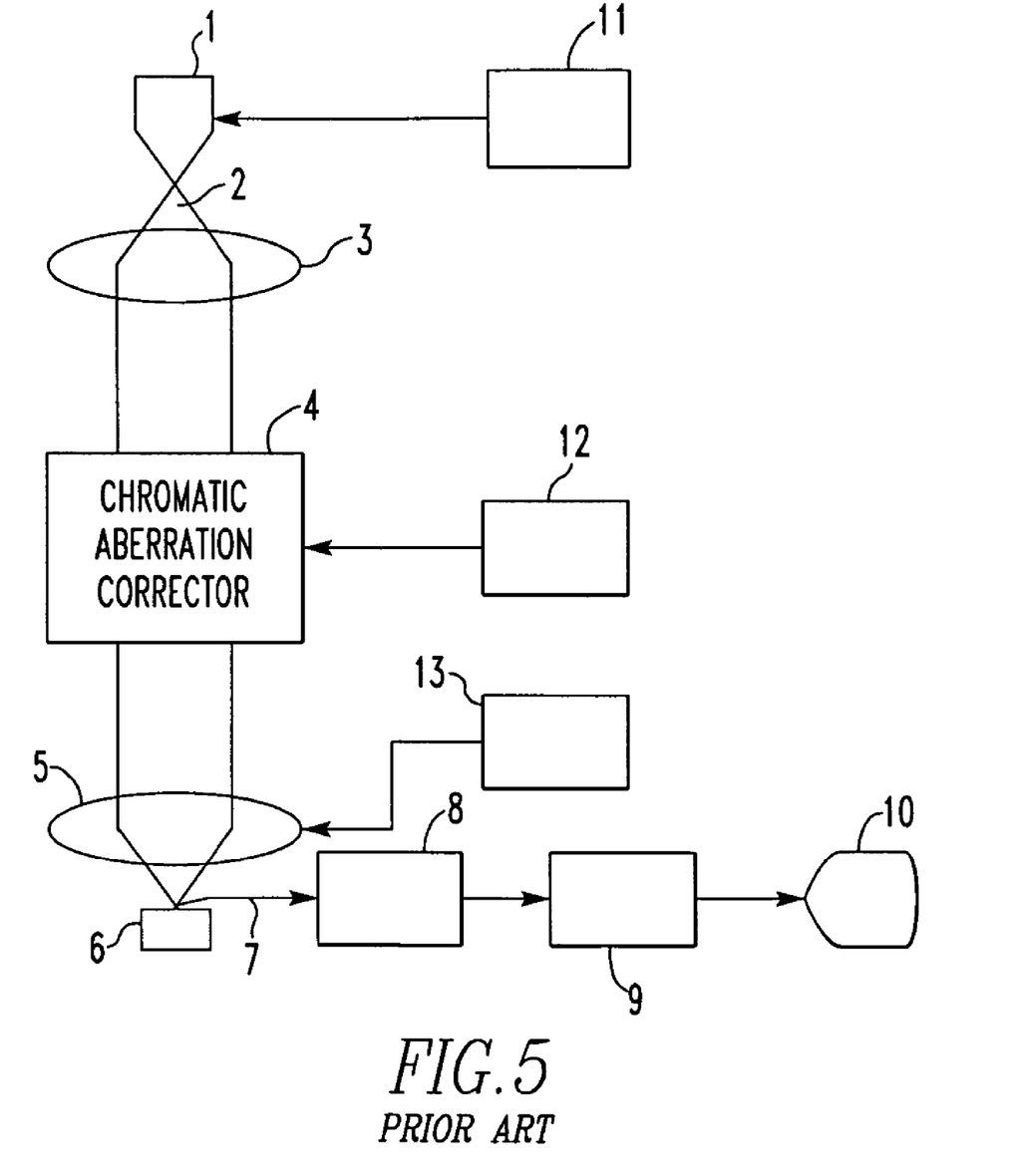
FIG. 5 is a schematic block diagram of the prior art system.

A scanning electron microscope is described as an example of specimen surface imaging instrument using charged particles by referring to FIG. 5, which depicts an example of configuration of the prior art instrument. This prior art instrument is equipped with an aberration corrector. An emitter 1 emits an electron beam 2 toward a chromatic aberration corrector 4. The beam 2 hitting the corrector 4 is controlled by a condenser lens 3 acting on the beam 2. The beam 2 is focused onto a surface of a specimen 6 by an objective lens 5 from the chromatic aberration corrector 4.

The electron beam 2 is scanned over the surface of the specimen 6. Secondary electrons 7 ejected from the surface of the specimen 6 are detected by a secondary electron detector 8 in synchronism with the scanning. Thus, the secondary electrons are displayed as an image on a display device 10 in synchronism with the scan signal. Since the detection efficiency for secondary electrons is normally low, the output signal from the detector is accumulated by an image accumulator 9. This enhances the ratio of the intensity of the signal component to noise intensity. Known examples of the aberration corrector are described, for example, in the following references: J. Zach, International Patent Application Number WO 01/56057 A1 (2000); V. H. Rose, Optik 33, Heft 1, 1(1971); J. Zach, Optik 83, No. 1, 30 (1989); and J. Zach and M. Haider, Nucl. Instr. and Meth. in Phys. Res. A 363, 316 (1995)

A chromatic aberration corrector using multipole elements described in the J. Zach, V. H. Rose, and J Zach et al. references which constitute well-known techniques of this kind is now described as an example. A chromatic aberration corrector corrects chromatic aberrations in the whole system. However, it is difficult to judge whether the aberrations have been actually corrected from the SEM image (scanned image), because the electron beam 2 is focused to some extent on the specimen surface even if aberrations are contained. In the above-cited well-known techniques, the operator judges the sizes of chromatic aberrations from the SEM image displayed on the display device 10 and manually manipulates an aberration corrector controller 12, thus correcting the chromatic aberrations. The prior art method of manually correcting chromatic aberrations is described below.

Electrons are ejected from the emitter 1 at various accelerations. The energies are distributed from about 0.2 to 0.9 eV at a field emission emitter or thermal field emitter. When an electron having an average energy is focused onto the specimen surface, an electron having an energy deviating by $\Delta E$ is focused to a position slightly deviating from the specimen surface in the direction of travel of the electron beam by an amount $\Delta f$. If chromatic aberrations are taken into account up to the second order, the amount of deviation $\Delta f$ is given by $$\Delta f = Cc \, \Delta E + Kc \, \Delta E^2 \qquad (1)$$

where Cc and Kc indicate the chromatic aberration coefficients of the first and second orders, respectively, of the whole system for energy dispersion. Defocus given by Eq. (1) and due to each $\Delta E$ is combined with the distribution of $\Delta E$. Because of the resulting effect, the SEM image is observed as a blurred image. Since the amount of the blur is quite small, it is difficult to judge whether the chromatic aberrations have been corrected, by observing the SEM image.

Furthermore, the sign of Cc cannot be known only from the image blur. Accordingly, the potential at the emitter 1 is shifted by several volts by an energy shift controller 11 to shift the whole distribution of $\Delta E$. As a result, the whole system is underfocused or overfocused. Hence, it is possible to judge the sign of Cc.

When the emitter potential is varied by $+\Delta E$ by the energy shift controller 11, the image is blurred. It is now assumed that the strength of the objective lens 5 is varied by the objective lens controller 13 and that the image can be brought to a focus. Defocus $\Delta f_1$ can be known from the variation in the strength of the objective lens 5 occurring at this time. Similarly, defocus $\Delta f_2$ occurring when the emitter potential is varied by $-\Delta E$ can be known. Accordingly, from Eq. (1), Cc produced at this time is given by $$Cc = (\Delta f_1 - \Delta f_2)/2\Delta E \qquad (2)$$

The aberration corrector controller 12 is so manipulated that the value of Eq. (2) becomes equal to 0. In this way, the amount of correction to the chromatic aberration is adjusted. The chromatic aberration corrector 4 is made up of multipole elements. As described in the above-cited references, corrections can be made in the x- and y-directions independently. Accordingly, it is necessary to carry out the above-described procedure in the x- and y-directions.

The procedure for aberration correction is complex as mentioned above. There is the problem that considerably long time is required for an ordinary operator to master the technique for obtaining high-resolution images.

SUMMARY OF THE INVENTION

It is an object of the present invention to provide a method of correcting chromatic aberrations in a charged-particle beam in such a way that the operator can correct chromatic aberrations automatically simply by depressing a button without considering the complex procedure of aberration correction. It is another object of the present invention to provide a charged-particle beam system that can implement this method.

A first embodiment of the present invention is a method of chromatic aberration correction, the method comprising the steps of: scanning a charged-particle beam as a probe over a surface of a specimen to thereby obtain scanned images; extracting probe profiles from the scanned images; calculating chromatic aberrations in the charged-particle beam from the extracted probe profiles; and correcting the chromatic aberrations in the beam based on the calculated chromatic aberrations.

A second embodiment of the present invention is based on the first embodiment and further characterized in that the scanned images from which the probe profiles are extracted during the step of extracting the probe profiles consist of first, second, third, fourth, and fifth scanned images. The first scanned image is obtained when the charged-particle beam is just in focus on the specimen surface. The second scanned image is obtained when the beam has been underfocused on the specimen surface under conditions where the energy of the charged particles has been varied by $+\Delta E$. The third scanned image is obtained when the beam has been overfocused on the specimen surface under conditions where the energy of the charged particles has been varied by $+\Delta E$. The fourth scanned image is obtained when the beam has been underfocused on the specimen surface under conditions where the energy of the charged particles has been varied by −ΔE. The fifth scanned image is obtained when the beam has been overfocused under conditions where the energy of the charged particles has been varied by −ΔE. Line profiles are found based on the probe profiles. Based on the line profiles, the chromatic aberrations in the beam are calculated during the step of calculating the chromatic aberrations.

A third embodiment of the present invention is based on the first embodiment and further characterized in that amount ΔE by which the energy of the charged-particle beam is varied is set to 0.01 to 1% of the initial energy of the beam.

A fourth embodiment of the present invention is a charged-particle beam system for scanning a charged-particle beam as a probe over a surface of a specimen. The system comprises a chromatic aberration corrector for correcting chromatic aberrations in the charged-particle beam, probe profile extraction means for extracting probe profiles from scanned images produced by scanning the charged-particle beam as the probe over the surface of the specimen, chromatic aberration calculation means for calculating the chromatic aberrations in the beam from the extracted probe profiles, and correcting means for operating the chromatic aberration corrector based on the calculated chromatic aberrations.

A fifth embodiment of the present invention is based on the fourth embodiment and further characterized in that the scanned images from which the probe profiles are extracted by the probe profile extraction means consist of first, second, third, fourth, and fifth scanned images. The first scanned image is obtained when the charged-particle beam is just in focus on the specimen surface. The second scanned image is obtained when the beam has been underfocused on the specimen surface under conditions where the energy of the charged particles has been varied by +ΔE. The third scanned image is obtained when the beam has been overfocused under conditions where the energy of the charged particles has been varied by +ΔE. The fourth scanned image is obtained when the beam has been underfocused on the specimen surface under conditions where the energy of the charged particles has been varied by −ΔE. The fifth scanned image is obtained when the beam has been overfocused under conditions where the energy of the charged particles has been varied by −ΔE. The chromatic aberration calculation means calculates the chromatic aberrations in the beam based on line profiles that have been found based on the probe profiles.

A sixth embodiment of the present invention is based on the fifth embodiment and further characterized in that amount ΔE by which the energy of the charged-particle beam is varied is set to 0.01 to 1% of the initial energy of the beam.

A seventh embodiment of the present invention is based on the fourth embodiment and further characterized in that the chromatic aberration corrector is equipped with four stages of polar units. A first line image of the charged-particle beam which extends in the x-direction is formed within the second stage of polar unit. A second line image of the beam which extends in the y-direction is formed within the third stage of polar unit.

According to the first embodiment of the present invention, chromatic aberrations in the charged-particle beam are calculated from the probe profiles. The chromatic aberration corrector is operated based on the calculated chromatic aberrations. Thus, the chromatic aberrations in the beam can be corrected.

According to the second embodiment of the present invention, the line profiles are found from the five scanned images. The first scanned image is obtained when the charged-particle beam is just in focus. The second scanned image is obtained when the beam has been underfocused under conditions where the energy of the beam has been varied by +ΔE. The third scanned image is obtained when the beam has been overfocused under conditions where the energy of the beam has been varied by +ΔE. The fourth scanned image is obtained when the beam has been underfocused under conditions where the energy of the beam has been varied by −ΔE. The fifth scanned image is obtained when the beam has been overfocused under conditions where the energy of the beam has been varied by −ΔE. Since the chromatic aberrations in the beam can be calculated from the line profiles of these five images, all axial chromatic aberrations of the first to third order with respect to convergence angle and of the first order with respect to the energy dispersion can be obtained separately, and the chromatic aberrations can be corrected so as to reduce them.

If ΔE is too large, the effects of higher-order chromatic aberrations are too strong. This makes it difficult to judge the chromatic aberrations that should be corrected. Conversely, if ΔE is too small, the blur is too small. This makes it impossible to make a judgment. According to the third embodiment, the amount of shift of the energy can be set optimally.

According to the fourth embodiment of the present invention, the chromatic aberrations in the beam are calculated from the probe profiles by the chromatic aberration correction means. The chromatic aberration corrector is operated based on the calculated chromatic aberrations. Thus, the chromatic aberrations in the beam can be corrected.

According to the fifth embodiment of the present invention, line profiles are found from five scanned images. The first scanned image is obtained when the beam is just in focus. The second scanned image is obtained when the beam has been underfocused under conditions where the energy of the charged particle has been varied by +ΔE. The third scanned image is obtained when the beam has been overfocused under conditions where the energy of the charged particle has been varied by +ΔE. The fourth scanned image is obtained when the beam has been underfocused under conditions where the energy of the charged particles has been varied by −ΔE. The fifth scanned image is obtained when the beam has been overfocused under conditions where the energy of the charged particle has been varied by −ΔE. Since the chromatic aberrations in the beam can be calculated from the line profiles of these five images, all axial chromatic aberrations of the first to third order with respect to convergence angle and of the first order with respect to the energy dispersion can be obtained separately, and the chromatic aberrations can be corrected so as to reduce them.

If ΔE is too large, the effects of higher-order chromatic aberrations are too strong. This makes it difficult to judge the chromatic aberrations that should be corrected. Conversely, if ΔE is too small, the blur is too small. This makes it impossible to make a judgment. According to the sixth embodiment, the amount of shift of the energy can be set optimally.

According to the seventh embodiment of the present invention, a chromatic aberration corrector equipped with four stages of polar units is used. A first line image of the charged-particle beam which extends in the x-direction is formed within the second stage of polar unit. A second line image of the beam that extends in the y-direction is formed within the third stage of polar unit. Consequently, the chromatic aberrations in the beam can be corrected accurately.

Other objects and features of the present invention will appear in the course of the description thereof, which follows.

DESCRIPTION OF THE PREFERRED EMBODIMENTS

Embodiments of the present invention are hereinafter described in detail with reference to the accompanying drawings.

Figure 1:
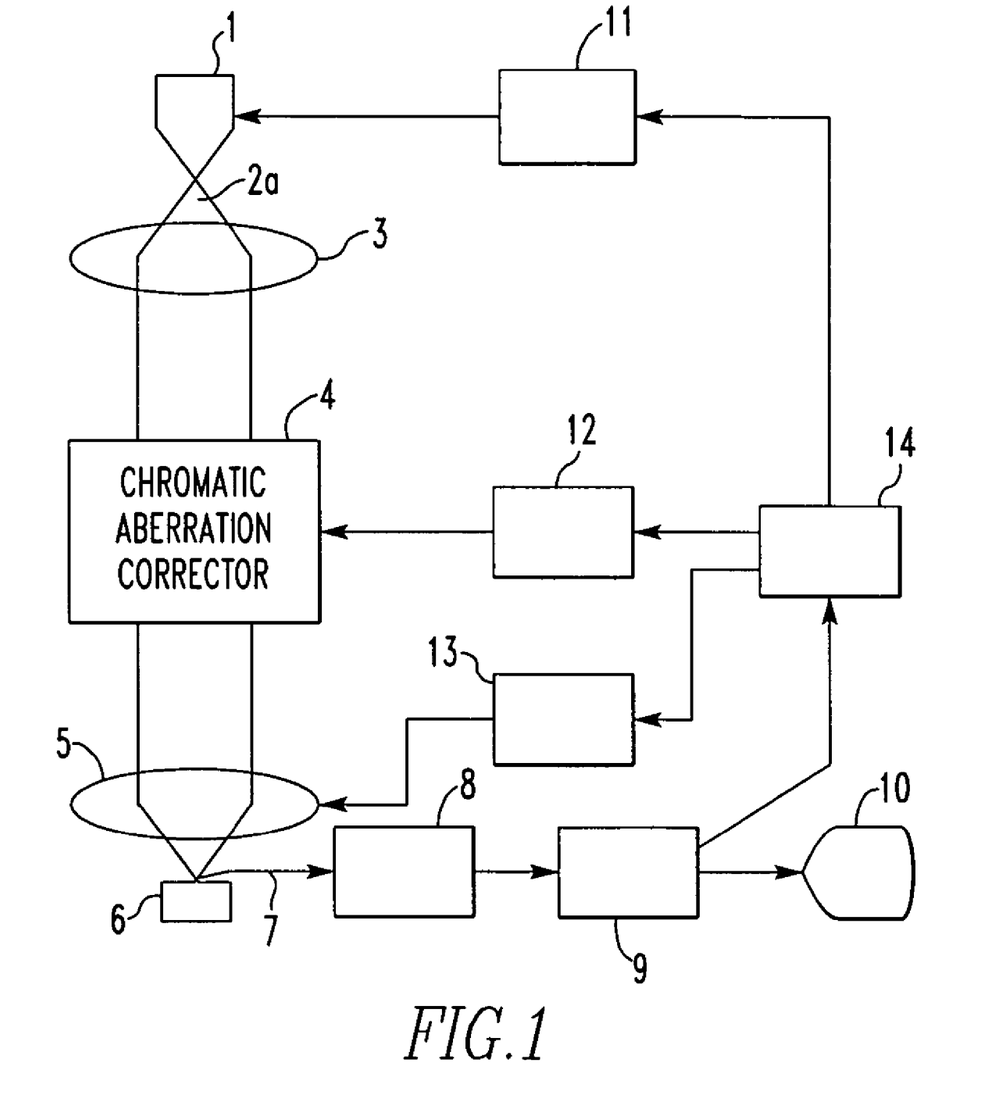
FIG. 1 is a schematic block diagram of a system illustrating one embodiment of the present invention.

FIG. 1 shows the configuration of a charged-particle beam system according to one embodiment of the present invention. Like components are indicated by like reference numerals in both FIGS. 1 and 5. The difference of this novel system shown in FIG. 1 compared with the prior art system shown in FIG. 5 is that an automatic chromatic aberration corrector is equipped to automate manipulations for correcting chromatic aberrations; in the past, such manipulations have been done manually by an operator. That is, automated correction of chromatic aberrations is started only if the operator depresses one manipulation start button.

Referring to FIG. 1, an emitter 1 emits a charged-particle beam 2a. The beam 2a is controlled by a condenser lens 3. A chromatic aberration corrector 4 acts to correct chromatic aberrations. An objective lens 5 focuses the beam 2a onto a specimen 6. Secondary electrons 7 ejected from the specimen 6 are detected by a secondary electron detector 8. The output signal from the detector 8 is accumulated by an image accumulator 9. The signal from the image accumulator 9 is displayed on a display device 10. An energy shift controller 11 varies the potential at the emitter 1. An aberration corrector controller 12 controls the chromatic aberration corrector 4. An objective lens controller 13 controls the objective lens 5. For example, a CRT or liquid crystal display is used as the display device 10. The automatic chromatic aberration corrector 14 is a component according to the present invention and gains an image from the image accumulator 9 in synchronism with the controllers 11 and 13 while automatically giving instructions to the energy shift controller 11 and to the objective lens controller 13. The corrector 14 automatically outputs instructions to the aberration corrector controller 12 to correct chromatic aberrations. For example, the charged-particle beam 2a is an electron beam or ion beam. The beam 2a is scanned as a focused probe over a surface of the specimen. As an example, a computer is used as the automatic chromatic aberration corrector 14. The operation of the charged-particle beam system constructed in this way is briefly described below.

The automatic chromatic aberration corrector 14 extracts probe profiles from scanned images created by the charged-particle beam 2a and calculates the chromatic aberrations in the system from the extracted probe profiles. The chromatic aberration corrector 4 is operated based on the calculated chromatic aberrations. In this way, the chromatic aberrations can be corrected.

The configuration of FIG. 1 is described in further detail. First, the automatic chromatic aberration corrector 14 causes the image accumulator 9 to receive and accumulate the secondary electron signal ejected from the specimen 6. A scanned image is obtained when the beam is just in focus. Then, the corrector 14 sends a control signal to the energy shift controller 11 to vary the energy of the charged-particle beam 2a by $+\Delta E$. At this time, scanned images are obtained under overfocused and underfocused conditions, respectively, by controlling the objective lens 5 from the objective lens controller 13. Then, the energy of the charged-particle beam 2a is varied by $-\Delta E$. At this time, scanned images are obtained under overfocused and underfocused conditions, respectively. In this way, five scanned images are derived in total. The automatic chromatic aberration corrector 14 obtains chromatic aberration coefficients (described in detail later) based on the five scanned images. After obtaining the chromatic aberration coefficients, the corrector 14 controls the aberration corrector controller 12 based on the coefficients. The aberration corrector controller 12 controls the chromatic aberration corrector 4 to correct the chromatic aberrations.

In this way, according to the present invention, chromatic aberrations in a charged-particle beam can be automatically corrected. In the present invention, automatic correction of chromatic aberrations is achieved by the automatic chromatic aberration corrector 14 only if the operator depresses a chromatic aberration correction button (not shown).

Figure 2:
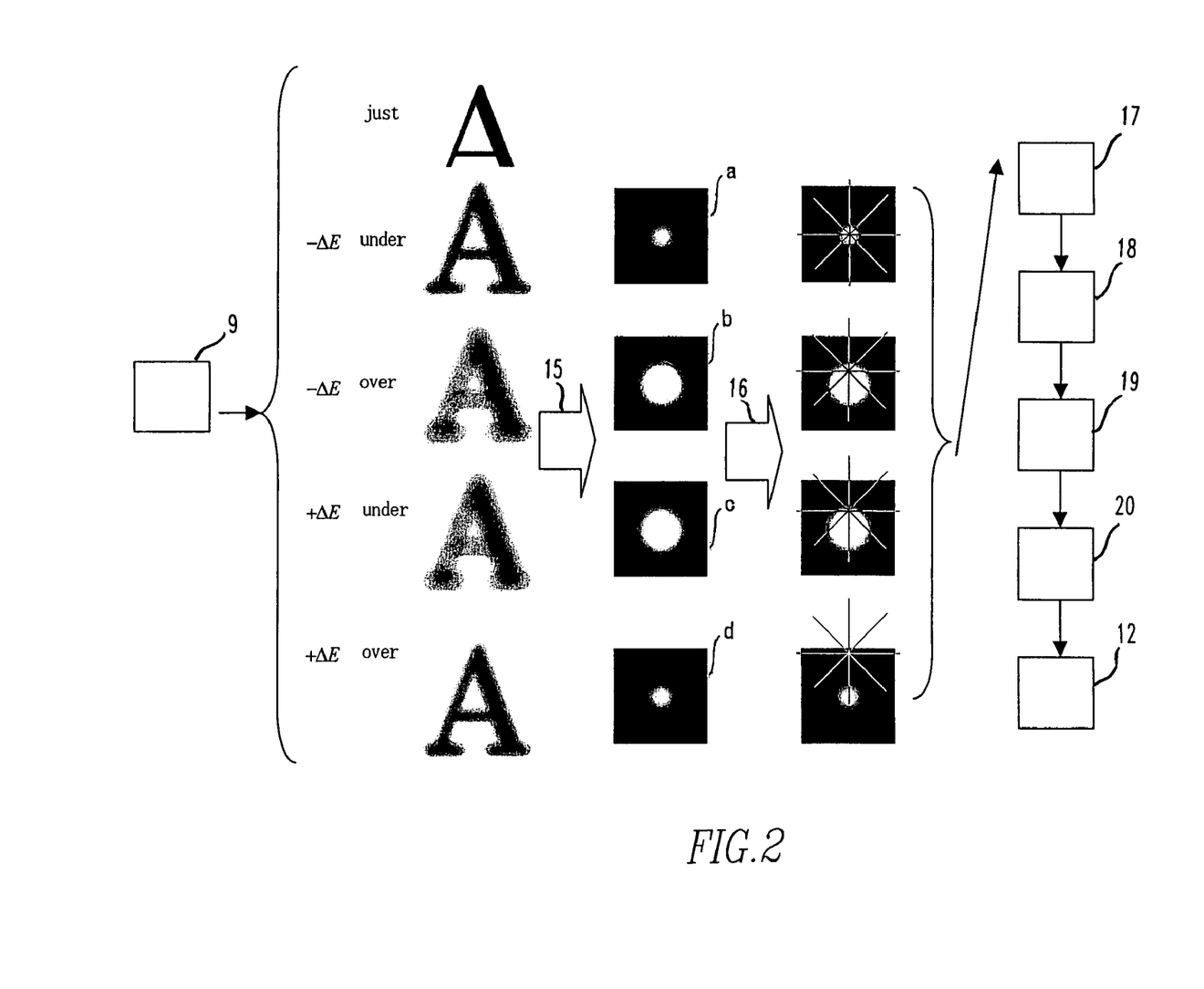
FIG. 2 is a diagram illustrating the operation of the system shown in FIG. 1.

FIG. 2 is a diagram illustrating the operation of the novel system shown in FIG. 1. This diagram depicts a sequence of operations performed by the automatic chromatic aberration corrector 14. Like components are indicated by like reference numerals in both FIGS. 1 and 2. In FIG. 2, the image accumulator 9 produces five scanned images, i.e., a first scanned image under accurately focused conditions, a fourth scanned image produced when the beam has been underfocused under conditions where the energy has been varied by $-\Delta E$, a fifth scanned image produced when the beam has been overfocused under conditions where the energy has been varied by $-\Delta E$, a second scanned image produced when the beam has been underfocused under conditions where the energy has been varied by $+\Delta E$, and a third scanned image produced when the beam has been overfocused under conditions where the energy has been varied by $+\Delta E$. A probe profile extractor 15 receives these five scanned images and extracts probe profiles. A line profile extractor 16 extracts a line profile from the extracted probe profiles.

A feature amount extractor 17 extracts an amount of feature from the line profiles. An aberration calculator 18 receives the output from the line profile feature amount extractor 17 and calculates aberrations. An aberration correction decision-making device 19 receives the output from the aberration calculator 18 and makes a decision as to whether further aberration correction should be made. A feedback amount-setting device 20 receives the output from the aberration correction decision-making device 19 and sets an amount of feedback for aberration correction. The aberration corrector controller 12 receives the output from the feedback amount setting device 20. The output from the aberration corrector controller 12 is supplied as a correcting signal to the chromatic aberration corrector 4. The probe profile extractor 15, line profile extractor 16, line profile feature amount extractor 17, aberration calculator 18, aberration correction decision-making device 19, and automatic feedback amount-setting device 20 are mounted within the chromatic aberration corrector 14. The operation of the system constructed in this way is described below.

As described previously, the five scanned images (SEM images) are obtained from the image accumulator 9. As mentioned above, these images are an image (just) produced when the beam is just in focus, an image ($-\Delta E$ under) produced when the beam has been underfocused under conditions where the energy has been varied by $-\Delta E$, an image ($-\Delta E$ over) produced when the beam has been overfocused under conditions where energy has been varied by −ΔE, an image (+ΔE under) produced when the energy has been underfocused under conditions where the energy has been varied by +ΔE, and an image (+ΔE over) produced when the beam has been overfocused under conditions where energy has been varied by +ΔE.

It has been experimentally confirmed that the amount of shift of energy ΔE should be set to 0.01 to 1% of the initial energy corresponding to the accelerating voltage set at first for the charged-particle beam, for the following reason. If ΔE is too large, the effects of higher-order aberrations are too great. This makes it difficult to judge the chromatic aberration coefficient Cc, for example, that should be corrected. Conversely, if ΔE is too small, blur becomes too small. Under this condition, it is impossible to judge the coefficient.

Instructions to be supplied to the energy shift controller 11 to vary the emitter potential by ±ΔE and instructions to be supplied to the objective lens controller 13 for overfocusing and underfocusing the beam are automatically given from the automatic chromatic aberration corrector 14 in synchronism with the operation for gaining the images from the image accumulator 9. Underfocused conditions mean that the strength of the objective lens is insufficient compared with the case where the beam is just in focus. The beam is focused behind the specimen surface. Overfocused conditions mean that the strength of the objective lens is too strong compared with the case when the beam is just in focus. The beam is focused ahead of the specimen surface.

The probe profile extractor 15 extracts probe profiles from these five SEM images using the image produced when the beam is just in focus as a reference. The method is known as described in WO 01/56057 A1. As a result, four probe profiles a to dare obtained as shown in FIG. 2. The line profile extractor 16 takes a line profile from each of the probe profiles around the center of gravity of the probe profile. The line profile feature amount extractor 17 finds the width, right and left asymmetry, and radius of curvature around the center for each of the line profiles. The aberration calculator 18 calculates aberrations from these amounts of features.

The aberration correction decision-making device 19 makes a decision as to whether there remains any aberration to be corrected and as to which aberration should be corrected with priority. With respect to the aberrations which have been quantified by the aberration calculator 18 and specified by the aberration correction decision-making device 19, the feedback amount-setting device 20 supplies aberration correction signals to the aberration corrector controller 12 to correct these aberrations.

With respect to the aberrations specified by the aberration correction decision-making device 19, feedback is applied to the aberration corrector controller 12 to correct these aberrations. This sequence of operations is repeated until all the aberrations to be corrected by the aberration correction decision-making device 19 decrease down to sufficiently small values.

In this way, according to the present invention, line profiles are found from five scanned images (i.e., a scanned image produced when the beam is just in focus, a scanned image produced when the beam has been underfocused under conditions where the energy of the charged particles has been varied by +ΔE, a scanned image produced when the beam has been overfocused under conditions where the energy of the charged particles has been varied by +ΔE, a scanned image produced when the beam has been underfocused under conditions where energy of the charged particles has been varied by −ΔE, and a scanned image produced when the beam has been overfocused under conditions where the energy of the charged particles has been varied by −ΔE). Since the chromatic aberrations in the beam can be calculated from the line profiles of these five images, all axial chromatic aberrations of the first to third order with respect to convergence angle and of the first order with respect to the energy dispersion can be obtained separately, and the chromatic aberrations can be corrected so as to reduce them. The operation of each component is described in detail below.

(a) Line Profile Feature Amount Extractor

Let $f_l$ (l is 0, ±1, ±2, ...) be line profiles extracted by the line profile extractor 17. $f_0$ indicates the brightness at the center of gravity of each probe profile. The following amounts are found from the line profiles.

[Mathematical Formulas 1]

$$S = \sum_l f_l \tag{3}$$

$$T = \sum_l f_l^2 \tag{4}$$

$$\mu = \frac{1}{S} \sum_l l \cdot f_l \tag{5}$$

$$\sigma = \sqrt{\frac{1}{S} \sum_l l^2 \cdot f_l} \tag{6}$$

$$\rho = \frac{\sigma^2}{T} \sum_{\substack{l \\ (l \neq 0)}} \frac{1}{|l|} (f_l - f_0) \cdot f_l \tag{7}$$

where μ, σ, and ρ indicate amounts of features of line profiles (i.e., left-and-right asymmetry of each line profile, width, and unevenness around the center, respectively).

(b) Aberration Calculator

The following parameters $C_0$ to $C_{11}$ are found from the amounts of features μ, σ, and ρ of the line profiles, and are used as measures of the aberrations. Subscript "u+,k" means the direction of $\theta k = (\pi/N)k$ of a probe profile in underfocused conditions with +ΔE". The amounts of features are found from the line profiles.

Similarly, subscript "o+,k" means the direction of θk of a probe profile in overfocused conditions with +ΔE. The amounts of features are found from the line profiles. Subscript "u−,k" means the direction of θk of a probe profile in underfocused conditions with −ΔE. The amounts of features are found from the line profiles. Subscript "o−,k" means the direction of θk of a probe profile in overfocused conditions with −ΔE. The amounts of features are found from the line profiles.

[Mathematical Formulas 2]

$$C_0 = \frac{1}{2\Delta E} \frac{2}{N} \tag{8}$$

$$\sum_k ((\mu_{u+,k} + \mu_{o+,k}) - (\mu_{u-,k} + \mu_{o-,k})) \cos\theta_k \quad \text{(chromatic x-coma)}$$

$$C_1 = \frac{1}{2\Delta E} \frac{2}{N} \tag{9}$$

$$\sum_k ((\mu_{u+,k} + \mu_{o+,k}) - (\mu_{u-,k} + \mu_{o-,k})) \sin\theta_k \quad \text{(chromatic y-coma)}$$

$$C_2 = \frac{1}{2\Delta E} \frac{2}{N} \tag{10}$$

$$\sum_k ((\mu_{u+,k} + \mu_{o+,k}) - (\mu_{u-,k} + \mu_{o-,k})) \cos 3\theta_k \quad \text{(chromatic x-triangle)}$$

-continued $$C_3 = \frac{1}{2\Delta E} \frac{2}{N} \sum_k ((\mu_{u+,k} + \mu_{o+,k}) - (\mu_{u-,k} + \mu_{o-,k}))\sin 3\theta_k \quad \text{(chromatic y-triangle)} \tag{11}$$

$$C_4 = \frac{1}{2\Delta E} \frac{2}{N} \sum_k ((\sigma_{u+,k} - \sigma_{o+,k}) - (\sigma_{u-,k} - \sigma_{o-,k})) \quad \text{(chromatic aberration)} \tag{12}$$

$$C_5 = \frac{1}{2\Delta E} \frac{2}{N} \sum_k ((\sigma_{u+,k} - \sigma_{o+,k}) - (\sigma_{u+,k} - \sigma_{o+,k})) \cos 2\theta_k \quad \text{(chromatic xy astigmatism)} \tag{13}$$

$$C_6 = \frac{1}{2\Delta E} \frac{2}{N} \sum_k ((\sigma_{u+,k} - \sigma_{o+,k}) - (\sigma_{u+,k} - \sigma_{o+,k})) \sin 2\theta_k \quad \text{(chromatic 45°-astigmatism)} \tag{14}$$

$$C_7 = \frac{1}{2\Delta E} \frac{2}{N} \sum_k ((\sigma_{u+,k} - \sigma_{o+,k}) - (\sigma_{u-,k} - \sigma_{o-,k})) \cos 4\theta_k \quad \text{(chromatic cos 4fold)} \tag{15}$$

$$C_8 = \frac{1}{2\Delta E} \frac{2}{N} \sum_k ((\sigma_{u+,k} - \sigma_{o+,k}) - (\sigma_{u-,k} - \sigma_{o-,k}))\sin 4\theta_k \quad \text{(chromatic sin 4fold)} \tag{16}$$

$$C_9 = \frac{1}{2\Delta E} \frac{2}{N} \sum_k ((\rho_{u+,k} - \rho_{o+,k}) - (\rho_{u-,k} - \rho_{o-,k})) \quad \text{(chromatic spherical)} \tag{17}$$

$$C_{10} = \frac{1}{2\Delta E} \frac{2}{N} \sum_k ((\rho_{u+,k} - \rho_{o+,k}) - (\rho_{u-,k} - \rho_{o-,k}))\cos 2\theta_k \quad \text{(chromatic xy-star)} \tag{18}$$

$$C_{11} = \frac{1}{2\Delta E} \frac{2}{N} \sum_k ((\rho_{u+,k} - \rho_{o+,k}) - (\rho_{u-,k} - \rho_{o-,k}))\sin 2\theta_k \quad \text{(chromatic 45°-star)} \tag{19}$$

where $C_0$ relates to chromatic x-coma, $C_1$ relates to chromatic y-coma, $C_2$ relates to chromatic x-triangle, $C_3$ relates to chromatic y-triangle, $C_4$ relates to a chromatic aberration, $C_5$ relates to chromatic xy, $C_6$ relates to chromatic 45°-astigmatism, $C_7$ relates to chromatic cos 4fold, $C_8$ relates to chromatic sin 4fold, $C_9$ relates to chromatic spherical aberration, $C_{10}$ relates to chromatic xy-star, and $C_{11}$ relates to chromatic 45°-star.

(c) Aberration Correction Decision-Making Device

The aberration correction decision-making device 19 makes a decision as to whether there still remains any aberration to be corrected. For example, the value of Mathematical Formula 3 is found:

[Mathematical Formula 3]

$$C = \sqrt{\frac{\sum_{i=0}^{11} W_i C_i^2}{\sum_{i=0}^{11} W_i}} \tag{20}$$

If the relation $C<\delta$ holds, the aberration correction is ended. In the above equation, $W_i$ is the weight of each aberration about the decision criterion as to whether focusing has been achieved, and $\delta$ indicates the strictness of the decision criterion. The aberration correction decision-making device 19 makes a decision as to which aberration should be corrected with priority. Each aberration can be independently quantified. However, when some aberration appears very conspicuously, there is the possibility that the accuracy of quantification of other aberrations deteriorates. Especially, $C_9$, $C_{10}$, and $C_{11}$ have the same symmetry as $C_4$, $C_5$, and $C_6$, respectively, but are higher-order aberrations than the latter aberrations. Therefore, when $C_4$, $C_5$, and $C_6$ appear in large amounts, there is the possibility that the accuracy of quantification of $C_9$, $C_{10}$, and $C_{11}$ deteriorates. To prevent this, a threshold value is set for each individual aberration. If the threshold value for an aberration is exceeded, only this aberration is first corrected.

(d) Feedback Amount-Setting Device

Figure 3:
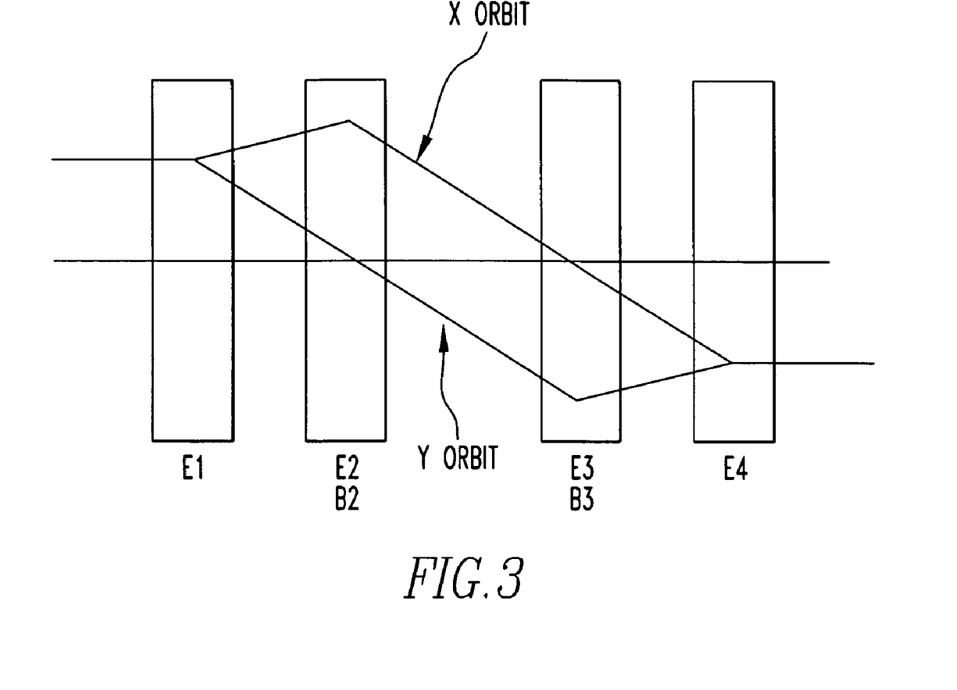
FIG. 3 is a ray diagram illustrating one example of aberration corrector.

Fields to be applied to the chromatic aberration corrector 4 to correct the aberrations specified by the aberration correction decision-making device 19 out of the outputs $C_0$ to $C_{11}$ from the aberration calculator 18 are found. As an example, as shown in FIG. 3, a case is discussed in which a chromatic aberration corrector equipped with four stages of polar units or electrodes produces a first line image of the charged-particle beam extending in the x-direction within the second stage of polar unit and a second line image of the beam extending in the y-direction within the third stage of polar unit.

Normal quadrupole electric fields E1–E4 applied to the first through fourth stages of polar units are used to create such a primary orbit. Besides, normal quadrupole magnetic fields B2 and B3 having on-axis distribution analogous to that of the fields E2 and E3 can be superimposed on the second and third stages of polar units. A combination of the fields E2 and B2 makes it possible to vary only the x-direction chromatic aberration orbit without varying the primary orbit. Similarly, a combination of the electric field E3 and the magnetic field B3 makes it possible to vary only the y-direction chromatic aberration orbit without varying the primary orbit.

Figure 4:
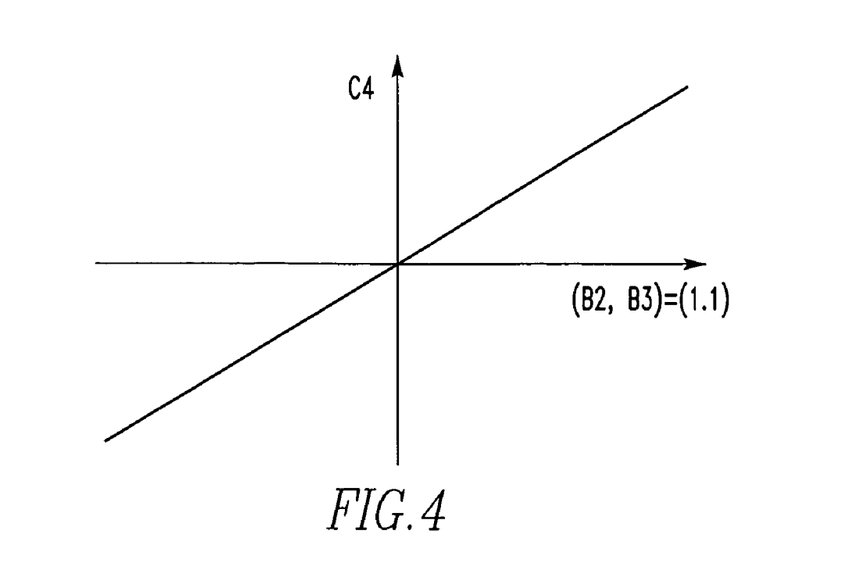
FIG. 4 is a diagram illustrating variation of C4.

When the fields B2 and B3 are varied at a ratio of 1:1 while maintaining the primary orbit with the E2 and E3, C4 that is quantified as given by Eq. (12) varies linearly as shown in FIG. 4. Similarly, when B2 and B3 are varied at a ratio of –1:1 while maintaining the primary orbit with the E2 and E3, C5 that is given by Eq. (13) varies also linearly. Accordingly, if the tilts of these straight lines are previously found by a simulation or experiment, it can be known which fields should be varied to correct aberrations in response to the output from the aberration calculator 18. In this way, according to the present invention, a chromatic aberration corrector having four stages of polar units is used. A first line image of a charged-particle beam which extends in the x-direction is formed in the second stage of polar unit. A second line image of the beam extending in the y-direction is formed in the third stage of polar unit. Consequently, chromatic aberrations in the beam can be corrected accurately.

The advantages of the present invention are as follows.

1. Since the procedure of chromatic aberration correction has been automated, even an ordinary operator who does not know a manual method of aberration correction can obtain high-resolution images.

2. The operator can manipulate the system without consideration of the aberration corrector having a complex configuration.

3. In the past, manual correction of chromatic aberrations has been made in the x- and y-directions independently. Therefore, it has taken a long time to make the correction. According to the present invention, however, chromatic aberration correction is judged in the x- and y-directions simultaneously. Consequently, the correction can be made in a shorter time.

Having thus described my invention with the detail and particularity required by the Patent Laws, what is desired protected by Letters Patent is set forth in the following claims.

The invention claimed is:

1. A method of correcting chromatic aberrations in a charged-particle beam comprising the steps of:
scanning the charged-particle beam as a probe over a surface of the specimen to obtain scanned images:
extracting probe profiles from the scanned images:
calculating chromatic aberrations in the beam from the extracted probe profiles: and
correcting the chromatic aberrations in the beam based on the calculated chromatic aberrations,
wherein the scanned images from which the probe profiles are extracted during said step of extracting the probe profiles consist of first through fifth scanned images, the first scanned image being obtained when the charged-particle beam is just in focus on the specimen surface, the second scanned image being obtained when the beam has been underfocused on the specimen surface under conditions where the energy of the charged particles has been varied by +E, the third scanned image being obtained when the beam has been overfocused under conditions where the energy of the charged particles has been varied by +E, the fourth scanned image being obtained when the beam has been underfocused on the specimen surface under conditions where the energy of the charged particles has been varied by −E, and the fifth scanned image being obtained when the beam has been overfocused on the specimen surface under conditions where the energy of the charged particles has been varied by −E, and
wherein chromatic aberrations in the beam are calculated during said step of calculating the chromatic aberrations based on the line profiles found based on the probe profiles.

2. A method of correcting chromatic aberrations in a charged-particle beam as set forth in claim 1, wherein amount E by which the energy of said charged-particle beam is shifted is set to 0.01 to 1% of the initial energy of the beam.

3. A charged-particle beam system for scanning a charged-particle beam as a probe over a surface of a specimen, said system comprising:
a chromatic aberration corrector for correcting chromatic aberrations in the charged-particle beam:
probe profile extraction means for extracting probe profiles from scanned images produced by scanning the charged-particle beam as the probe over the surface of the specimen:
chromatic aberration calculation means for calculating the chromatic aberrations in the beam from the extracted probe profiles: and
correcting means for operating the chromatic aberration corrector based on the calculated chromatic aberrations,
wherein said scanned images from which the probe profiles are extracted by said probe profile extraction means consist of first through fifth scanned images, the first scanned image being obtained when the charged-particle beam is just in focus on the specimen surface, the second scanned image being obtained when the beam has been underfocused on the specimen surface under conditions where the energy of the charged particles has been varied by +E, the third scanned image being obtained when the beam has been overfocused under conditions where the energy of the charged particles has been varied by +E, the fourth scanned image being obtained when the beam has been underfocused on the specimen surface under conditions where the energy of the charged particles has been varied by −E, and the fifth scanned image being obtained when the beam has been overfocused on the specimen surface under conditions where the energy of the charged particles has been varied by −E, and
wherein said chromatic aberration calculation means calculates the chromatic aberrations in the charged-particle beam based on the line profiles found based on the probe profiles.

4. A charged-particle beam system as set forth in claim 3, wherein amount E by which the energy of the charged-particle beam is shifted is set to 0.01 to 1% of the initial energy of the beam.

5. A charged-particle beam system for scanning a charged-particle beam as a probe over a surface of a specimen, said system comprising:
a chromatic aberration corrector for correcting chromatic aberrations in the charged-particle beam;
probe profile extraction means for extracting probe profiles from scanned images produced by scanning the charged-particle beam as the probe over the surface of the specimen;
chromatic aberration calculation means for calculating the chromatic aberrations in the beam from the extracted probe profiles; and
correcting means for operating the chromatic aberration corrector based on the calculated chromatic aberrations, wherein said chromatic aberration corrector is equipped with four stages of polar units, and wherein a first line image of the charged-particle beam which extends in an x-direction is formed within the second stage of polar unit and a second line image of the beam which extends in a y-direction is formed within the third stage of polar unit.

* * * * *

UNITED STATES PATENT AND TRADEMARK OFFICE
CERTIFICATE OF CORRECTION

| | |
|---|---|
| PATENT NO. | : 7,205,551 B2 |
| APPLICATION NO. | : 11/226907 |
| DATED | : April 17, 2007 |
| INVENTOR(S) | : Uno |

It is certified that error appears in the above-identified patent and that said Letters Patent is hereby corrected as shown below:

Title Page: Add the following:
Item
-- (30)    Foreign Application Priority Data

Sept. 14, 2004      (JP)      2004-266528 --

Signed and Sealed this

Eighteenth Day of September, 2007

JON W. DUDAS
*Director of the United States Patent and Trademark Office*